United States Patent [19]
Yamagata et al.

[11] Patent Number: 6,103,598
[45] Date of Patent: Aug. 15, 2000

[54] PROCESS FOR PRODUCING SEMICONDUCTOR SUBSTRATE

[75] Inventors: Kenji Yamagata, Sagamihara; Takao Yonehara, Atsugi; Nobuhiko Sato; Kiyofumi Sakaguchi, both of Yokohama, all of Japan

[73] Assignee: Canon Kabushiki Kaisha, Tokyo, Japan

[21] Appl. No.: 08/678,694

[22] Filed: Jul. 11, 1996

[30] Foreign Application Priority Data

Jul. 13, 1995 [JP] Japan ..................... 7-177189

[51] Int. Cl.⁷ .................................. H01L 21/306
[52] U.S. Cl. .......................... 438/459; 438/753
[58] Field of Search .................. 438/753, 756, 438/751, 750, 749, 745, 459

[56] References Cited

U.S. PATENT DOCUMENTS

| | | | |
|---|---|---|---|
| 5,190,613 | 3/1993 | Yamagata | 156/600 |
| 5,236,544 | 8/1993 | Yamagata | 156/603 |
| 5,278,092 | 1/1994 | Sato | 437/90 |
| 5,278,093 | 1/1994 | Yonehara | 437/109 |
| 5,290,712 | 3/1994 | Sato et al. | 437/24 |
| 5,320,907 | 6/1994 | Sato | 428/446 |
| 5,363,793 | 11/1994 | Sato | 117/2 |
| 5,374,581 | 12/1994 | Ichikawa et al. | 437/62 |
| 5,403,751 | 4/1995 | Nishida et al. | 437/2 |
| 5,403,771 | 4/1995 | Nishida et al. | 437/89 |
| 5,457,058 | 10/1995 | Yonehara | 437/24 |

FOREIGN PATENT DOCUMENTS

| | | |
|---|---|---|
| 469630A2 | 2/1992 | European Pat. Off. |
| 499488A3 | 8/1992 | European Pat. Off. |
| 0553852A2 | 8/1993 | European Pat. Off. |
| 554795A1 | 8/1993 | European Pat. Off. |
| 5021338 | 1/1993 | Japan |
| 6342784 | 12/1994 | Japan |

OTHER PUBLICATIONS

Osamu Tabata et al., "Anisotropic etching of silicon in TMAH solutions", *Sensors and Actuators A Physical A34* (1992) pp. 51–57.

T. Takebe et al., Fundamental Selective Etching Characteristics of $HF+H_2O_2+H_2O$ Mixtures for GaAs, *J. Electrochem, Soc.*, vol. 140, 1993, pp. 1169–1180.

G. Bomchil et al., "Porous silicon: The material and its applications to SOI Technologies", *Microelectronic Engineering*, 1988, pp. 293–310.

D.K. Sadana et al., "Nano–Defects in Commercial Bonded SOI and Simox", *Proceedings 1994 IEEE International SOI Conference*, 1994, pp. 111–114.

*Primary Examiner*—Marion McCamish
*Assistant Examiner*—Cheryl Juska
*Attorney, Agent, or Firm*—Fitzpatrick, Cella, Harper & Scinto

[57] ABSTRACT

A process for producing a semiconductor substrate is provided which comprises providing a first substrate made of silicon having a porous silicon layer formed thereon by making porous the substrate silicon and a nonporous monocrystalline silicon layer epitaxially grown on the porous silicon layer, laminating the first substrate onto a second substrate in a state that at least one of lamination faces of the first and the second substrates has a silicon oxide layer and the nonporous monocrystalline silicon layer is interposed between the laminated substrates, and removing the porous silicon layer by etching, wherein the porous silicon layer is removed by etching with an etchant which etches the nonporous monocrystalline silicon layer and the silicon oxide layer at respective etching rates of not more than 10 angstroms per minute.

54 Claims, 10 Drawing Sheets

PROCESS FOR PRODUCING SEMICONDUCTOR SUBSTRATE

BACKGROUND OF THE INVENTION

1. Field of the Invention

The present invention relates to a process for producing an SOI substrate which has an excellent monocrystalline layer like a monocrystalline wafer on an insulating material with good uniformity and controllability in production.

2. Related Background Art

Formation of a monocrystalline semiconductor layer on an insulating material is well known as a silicon-on-insulator technique (SOI). Many studies have been made of the SOI technique because of many advantages which cannot be achieved by a usual bulk silicon substrate for silicon integrated circuits.

One example of recently reported SOIs is a so-called "laminated SOI". This laminated SOI is produced by contact-bonding of two wafers with the respective mirror-polished faces having an insulation film on at least one of the faces, heat-treatment to strengthen the interface bonding, and polishing or etching of one of the wafers to leave a silicon monocrystalline thin film of a desired thickness (an active layer) on an insulating film. In this technique of laminated SOI formation, the most important step is polishing or etching of the silicon substrate into a thin film, in which the silicon substrate having a thickness of several hundred microns is polished or etched uniformly to a thickness of several microns or less than one micron. This process is extremely difficult technically in control and uniformity.

The processes of thin silicon film formation are classified into two types. In the one type of process, the thin film is formed by polishing only (BPSOI: Bonding and Polishing SOI). In the other type of process, an etch-stopping layer is provided immediately on the thin film to be left, and etching is conducted in two steps comprising etching of the substrate and etching of the etch-stopping layer (BESOI: Bond and Etchback SOI).

In the BPSOI processes, the thickness of the silicon film meant to remain cannot readily be controlled, because the polishing operation is conducted by reference to the face of the stand of the polishing machine on which the specimen to be polished is placed, and any thickness distribution of the supporting substrate wafer itself affects the thickness distribution of the active layer. Usually the thickness of the active layer of the thin film SOI should be controlled within several ten angstroms. However, the substrate itself cannot be controlled practically to have the thickness within such a range, and therefore the BPSOI process cannot readily control the thickness of the active layer.

In most of the BESOI processes, on the other hand, the active silicon layer is formed by epitaxial growth on a preliminarily formed etch-stopping layer. Therefore, at the moment, the BESOI processes are considered to be advantageous in achieving uniformity of film thickness. However, the etch-stopping layer frequently contains an impurity at a higher concentration, and the selectivity of the etching in most cases depends on the impurity concentration. This means that diffusion of the impurities in annealing or like heat treatment after the lamination can change the etching characteristics. Generally, the etching rate, or the etching selectivity, changes depending on the impurity concentration at a ratio of several tens or several hundreds at the highest, which necessarily causes excessive etching or thickness distribution of the active layer.

A method is proposed by the inventors of the present invention in which the active layer has uniform thickness as in BESOI, and the selectivity of the etch-back is many-fold higher by a factor of several digits than the conventional BESOI. In the proposed method, the surface of the silicon substrate is made porous by anodization, an active silicon layer is epitaxially thereon, and the formed silicon layer is transferred onto another substrate by lamination to prepare an SOI substrate (Japanese Patent Application Laid-Open No. 5-21338). This method is based on the extremely high etching rate of the porous silicon by an etchant in comparison with that of the non-porous monocrystalline silicon, and enables production of an excellent SOI substrate at a low cost.

An etchant applicable to the aforementioned process has been proposed also by the applicants of the present invention (Japanese Patent Application Laid-Open No. 6-342784, etc.). According to the studies made by the inventors of the present invention, the high etching selectivity of the porous silicon can be obtained by use of a hydrofluoric acid type etchant such as a mixture of hydrofluoric acid and hydrogen peroxide.

However, it is reported recently that the hydrofluoric acid type etchant also etches crystal defects in the active layer (Proceedings of IEEE International SOI Conference, 1994, p.111). As the result of investigations made by the inventors of the present invention, this action of the etchant may form pinholes in the active layer, may corrode the underlying oxide film through the pinholes, or may form voids in the lamination interface between the substrates.

SUMMARY OF THE INVENTION

An object of the present invention is to provide a process for producing an SOI substrate employing a technique of selective etching of a porous layer, in which void formation caused by crystal defects in etching of the porous layer is reduced to an extremely low level.

Another object of the present invention is to provide a process for producing a semiconductor substrate in which voids in the lamination interface and defects in the nonporous monocrystalline silicon layer are decreased to an extremely low level.

The process for producing a semiconductor substrate of the present invention comprises providing a first substrate made of silicon having a porous silicon layer formed thereon by making the substrate porous and a nonporous monocrystalline silicon layer epitaxially grown on the porous silicon layer; laminating the first substrate onto a second substrate in a state that at least one of the lamination faces of the first and the second substrates has a silicon oxide layer and the nonporous monocrystalline silicon layer is interposed between the laminated substrates; and removing the porous silicon layer by etching, wherein the porous silicon layer is removed by etching with an etchant which etches the nonporous monocrystalline silicon layer and the silicon oxide layer at respective etching rates of not more than 10 angstroms per minute.

The above constitution of the present invention solves the aforementioned problems, and enables production of an SOI substrate of extremely high quality.

DESCRIPTION OF THE PREFERRED EMBODIMENTS

Figure 1A:
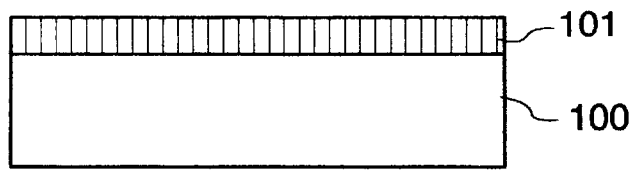
FIGS. 1A–1E illustrate schematically an example of the process of the present invention.

The process for producing a semiconductor substrate of the present invention has the constitution as mentioned above.

In an embodiment of the present invention, a first substrate is prepared by making porous a surface portion of a nonporous monocrystalline silicon substrate, and allowing nonporous monocrystalline silicon to grow epitaxially in a layer on the porous monocrystalline silicon. The first substrate is laminated with a second substrate such that the epitaxially grown nonporous monocrystalline silicon layer is interposed between the laminated substrates, and subsequently a part or the whole of the remaining unchanged nonporous monocrystalline silicon of the first substrate is removed mechanically by polishing or grinding.

The porous portion of the silicon substrate can be formed by anodization of the nonporous monocrystalline silicon substrate. The resulting porous silicon layer has many pores of an average diameter of about 600Å, and yet is monocrystalline.

The selective etching of the porous monocrystalline silicon layer proceeds by the following etching mechanism. First, an etching solution penetrates into the pores by capillarity and begins to etch the walls of the pores. If the rate of etching of the monocrystalline silicon is sufficiently low, the etching solution penetrates the porous layer to reach the interface between the active layer (the nonporous monocrystalline silicon layer formed by epitaxial growth on the porous layer) and the porous layer before the inner pore walls of the porous layer has been completely etched. When the thickness of the inner walls has become zero by etching, the entire porous layer collapses and disappears. In this etching, the active layer also is slightly etched. Practically the amount of etching of the active layer is about half or less of the inner wall thickness of the porous layer, namely several tens of angstroms, and therefore, most portion of the active layer remains unetched even if the thick porous layer is entirely removed by etching.

On the other hand, if the rate of etching of the monocrystalline silicon by the etching solution is sufficiently high, the etching proceeds from the external face of the porous layer more rapidly than the penetration of the etching solution by capillarity into the pores, and the porous layer is etched at uniform rate from the external face until the inner walls of the pores collapse. Successively the active layer is etched also at the same rate with poor etching selectivity.

More specifically, the etching proceeds selectively when the condition of $y_s < y_p$ is satisfied where $y_s$ is the amount (thickness) of etching from the external face of the porous layer at time t and $y_p$ is the distance of the penetration of the etching solution into the porous layer at the time t. The value of $y_s$ depends on the etching rate a, and the value of $y_p$ depends on the rate k of penetration of the etching solution into the pores. The value of $y_p$ is a function of the diameter and other properties of the pores. Usually, only a porous material of limited properties (porosity, etc.) is employed for satisfactory epitaxial growth of a good thin monocrystalline film thereon. Therefore, the k value is nearly constant, and the etching selectivity is determined only by the value of a.

The value of the etching rate a is preferably not larger than about 10 Å/min, more preferably about 2 Å/min from the results of experiments. The value a of less than 1 Å/min is not suitable since the total etching time is excessively long in spite of the sufficient selectivity. The value a of larger than 10 Å/min is not suitable since the etching selectivity is lower and remaining thin monocrystalline film is etched undesirably excessively to cause a larger film thickness distribution.

Conventionally, the selective etching is conducted by use of a hydrofluoric acid type etching solution which is adjusted to exhibit a sufficiently low rate of etching for monocrystalline silicon, exemplified typically by a 1:5 mixture of hydrofluoric acid (49%) and aqueous hydrogen peroxide (30%).

This is reasonable so far as the selective etching only is concerned. Conventional selective etching solutions are provided without consideration of the rate of etching of the defects in the active layer or etching of the underlying oxide layer.

The inventors of the present invention conducted the selective etching of the porous silicon by use of an etching solution which etches the monocrystalline silicon at a sufficiently low rate as conventional etching solutions and yet etches the underlying $SiO_2$ also at a low rate.

Figure 9:
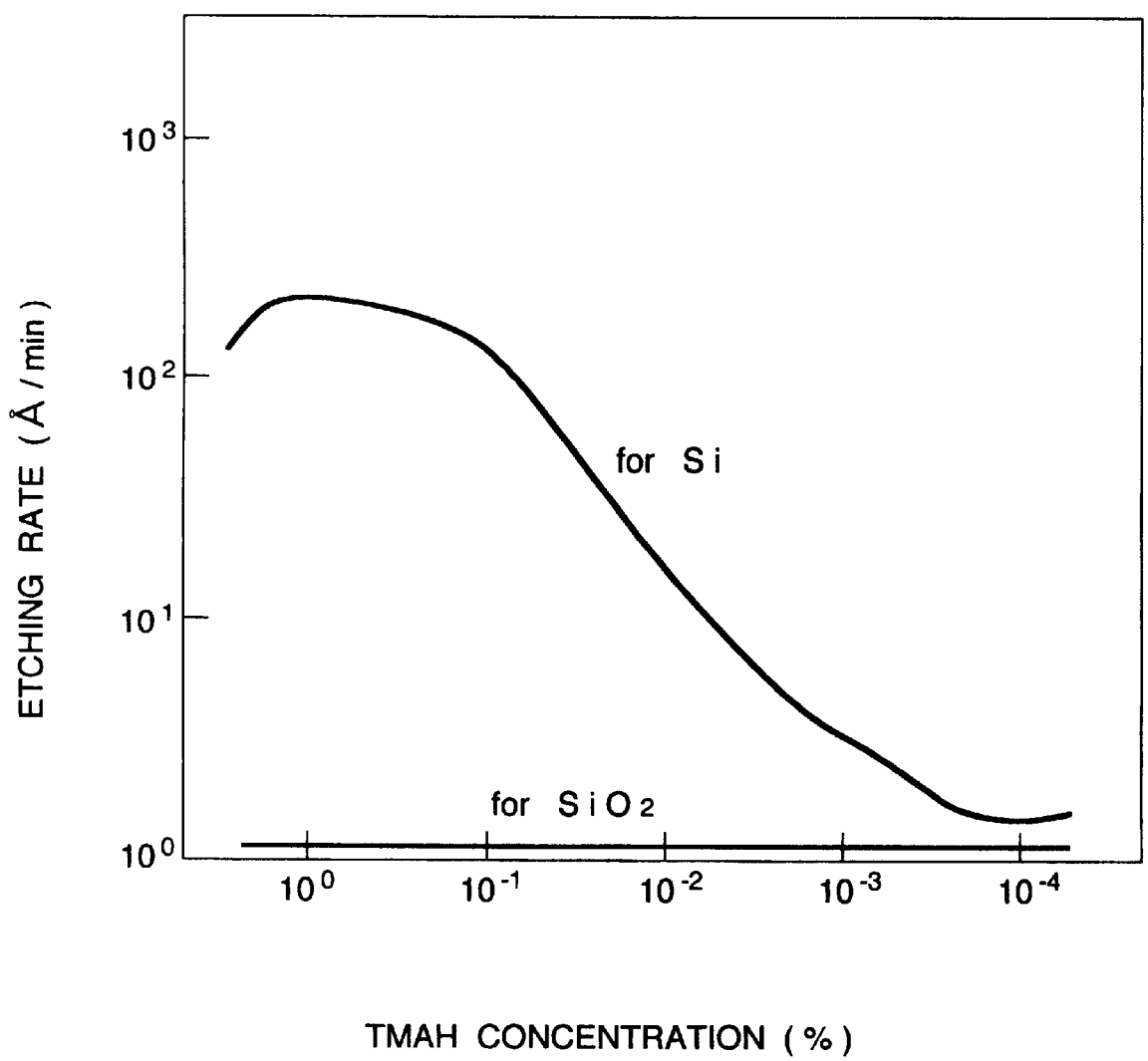
FIG. 9 is a graph showing dependency of the rate of etching of monocrystalline silicon and $SiO_2$ by a TMAH solution on the TMAH concentration.

An example of the employed etching solution is an organic alkali, TMAH (tetramethylammonium hydroxide). The aqueous TMAH solution etches the silicon at a rate depending on the concentration of the solution as shown in FIG. 9. The rate of etching of $SiO_2$ with this solution is below the detection limit independently of the solution concentration. Accordingly, for the selective etching of the porous material at an etching rate of not higher than 10 Å/min, the TMAH solution is used at a concentration of not higher than about 50 ppm.

Figure 10:
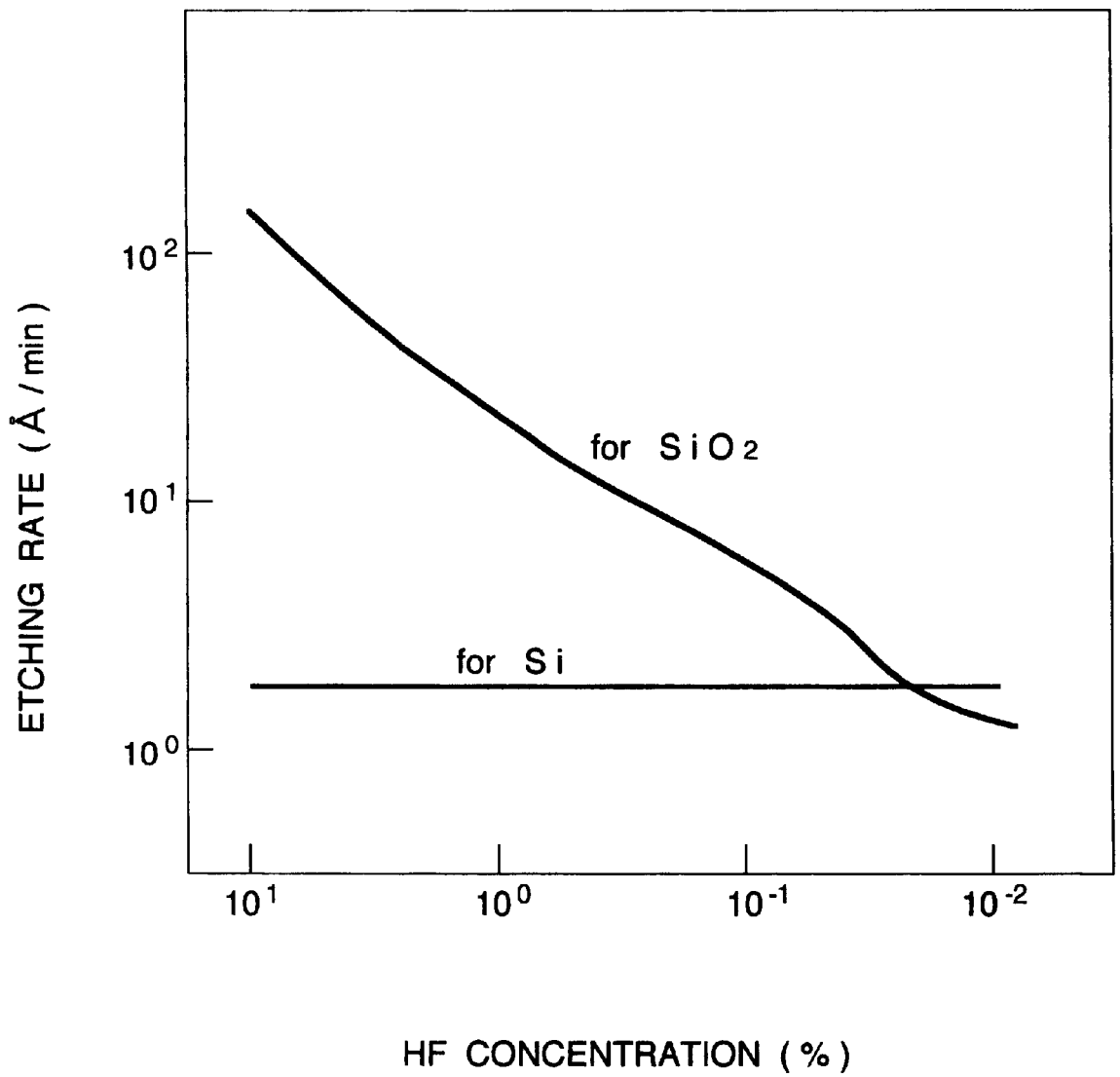
FIG. 10 is a graph showing dependency of the rate of etching of monocrystalline silicon and $SiO_2$ by a hydrofluoric acid-hydrogen peroxide mixture on the hydrofluoric acid concentration.

Another example of the employed etching solution is a mixture of hydrofluoric acid and aqueous hydrogen peroxide as shown in FIG. 10. This solution, differently from the TMAH solution, etches silicon at a rate of about 2–3 Å/min invariably over the wide concentration range, and etches $SiO_2$ at a rate as a function of the concentration. Accordingly, for etching of both of the porous material and $SiO_2$ at the etching rate of not higher than 10 Å/min, the hydrofluoric acid should be used at a concentration of not higher than about 0.5% relative to the aqueous hydrogen peroxide solution. It has been found that replacement of 80% of the above hydrogen peroxide with water does not significantly change the etching characteristics.

The alkali type etching solutions include aqueous KOH solutions, aqueous NaOH solutions, aqueous ammonia solutions ($NH_4OH$). These solutions etch $SiO_2$ at an extremely low etching rate independently of the solution concentration, similarly to the TMAH.

The hydrofluoric acid type etching solutions include mixtures of hydrofluoric acid, nitric acid, and water, and mixtures of hydrofluoric acid, nitric acid, acetic acid, and water. These etching solutions have concentration/etching characteristics similar to those of the hydrogen fluoride-hydrogen peroxide mixtures in a certain range.

The present invention is characterized by the etchant used for etching the porous layer as described above, and includes several embodiments for obtaining a SOI substrate of high quality. The process of the present invention is described by reference to drawings.

Embodiment 1

Embodiment 1 is explained by reference to FIGS. 1A–1E and FIGS. 8A–8B.

A monocrystalline silicon substrate 100 is anodized to form a porous silicon 101 (FIG. 1A). The thickness of the porous layer may be several to tens of angstroms on one face of the substrate. Otherwise, the entire silicon substrate 100 may be anodized.

Figure 8A:
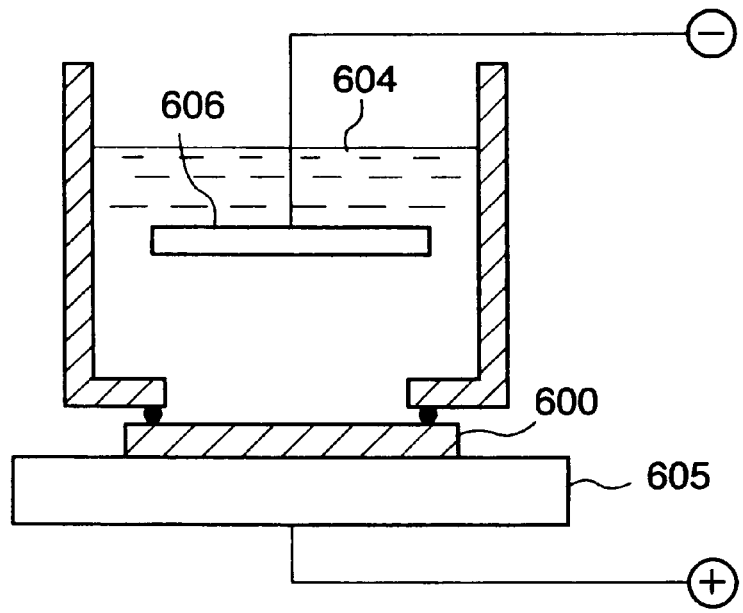
FIGS. 8A–8B illustrate schematically an apparatus for making a silicon substrate porous.
Figure 8B:
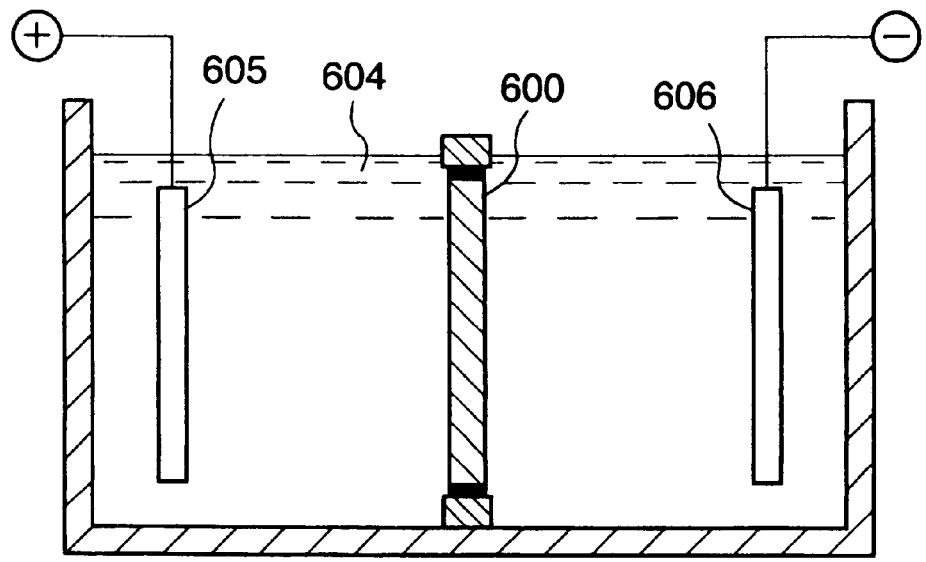

The process for forming porous silicon is described by reference to FIGS. 8A–8B. A P-type monocrystalline silicon substrate 600 is employed as the substrate. If an N-type one is used, it is limited to the one having a low resistance, or to be used under light irradiation to accelerate the hole formation. The substrate 600 is set on the apparatus shown in FIG. 8A such that one face of the substrate is in contact with a hydrofluoric acid type solution in which a negative electrode 606 is provided and the other face of the substrate is in contact with a positive metal electrode. Otherwise, the positive electrode 605' may be electrically connected through a solution 604' with the substrate as shown in FIG. 8B. In any way, porosity formation is caused on the face in contact with a hydrofluoric acid type solution at the negative electrode side. The hydrofluoric acid type solution 604 is usually a concentrated hydrofluoric acid solution (49% HF). Dilution of the concentrated hydrofluoric acid with pure water is not suitable since etching will occur at a concentration lower than a certain level depending on the applied electric current. Bubbles which are formed on the surface of the substrate 600 during the anodization may be removed effectively by addition of an alcohol as a surfactant. The alcohol includes methanol, ethanol, propanol, and isopropanol. Instead of adding the surfactant, the solution may be stirred by a stirrer during the anodization. The negative electrode 606 is made of a material resistant to the hydrofluoric acid solution such as gold (Au) and platinum (Pt). The positive electrode 605, which may be made of a generally used metallic material, is preferably coated on the surface with a metal film resistant to the hydrofluoric acid since the hydrofluoric acid solution 604 reaches the positive electrode 605 if the entire of the substrate 600 has come to be anodized. The electric current intensity for the anodization is not more than several hundred mA/cm$^2$, and is more than zero. The current intensity is determined within such a range that the epitaxial growth will occur satisfactorily on the external face of the formed porous silicon layer. Generally, at the higher intensity of the current, the anodization proceeds at the higher rate and the density of the porous silicon layer becomes lower, the pore volume becoming larger. Thereby the epitaxial growth conditions are varied.

Figure 1B:
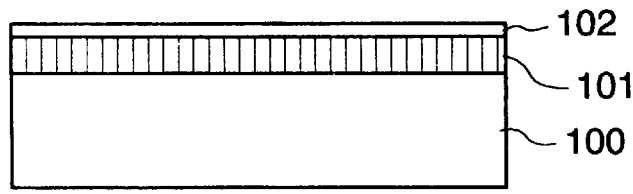

On the porous layer 101 formed as above, a nonporous monocrystalline silicon layer 102 is allowed to grow epitaxially (FIG. 1B). The epitaxial growth is caused by ordinary thermal CVD, low-pressure CVD, plasma CVD, molecular beam epitaxy, sputtering, or a like method. The grown layer thickness is controlled to be the same as the design thickness for the SOI.

Figure 1C:
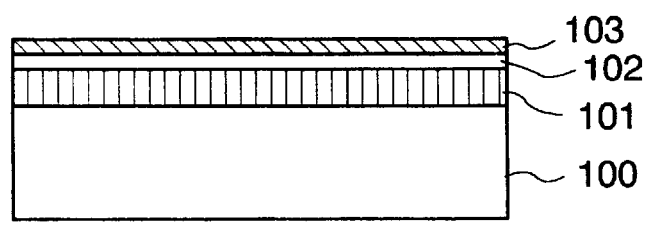

The surface of the epitaxial layer 102 is oxidized to form an $SiO_2$ layer 103 (FIG. 1C). (The oxidation process includes thermal oxidation.) If the epitaxial layer is laminated directly to the supporting substrate in the subsequent step, impurities are liable to segregate at the lamination interface, and dangling bonds of the atoms at the interface tend to increase to render unstable the properties of the resulting thin film device. Therefore, this surface oxidation is conducted to offset the above disadvantages. This oxidation step is not dispensable, and may be omitted by employing a device construction in which no trouble is caused by the above phenomena. The $SiO_2$ layer 103 serves as an insulation layer of the SOI substrate. The insulation layer should be formed on at least one face of the substrates to be laminated together. The insulation film can be formed in various ways. The oxidation film, when it is formed, is controlled to have a thickness sufficient to prevent contamination of the lamination interface from the external air.

Separately from the above substrate 100 having the oxidized epitaxial face, a supporting substrate 110 is provided which has an $SiO_2$ layer 104 on the surface thereof. The supporting substrate 110 is exemplified by a silicon substrate which has been oxidized at the surface (including thermally oxidized one), quartz glass, crystallized glass, any substrate onto which $SiO_2$ has been deposited.

Figure 1D:
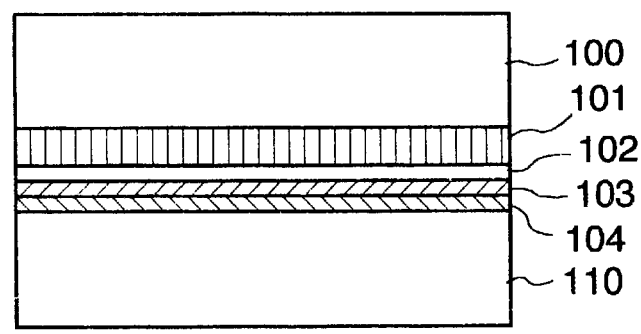

The above two substrates, after cleaning, are laminated together (FIG. 1D). The cleaning is conducted similarly as in usual cleaning of a semiconductor substrate (for example, cleaning prior to the oxidation).

Pressurization on the entire face of the substrate after the lamination is effective for strengthening the lamination bonding.

The laminate of the substrates is heat-treated. A higher temperature is preferred for the heat treatment. However, an excessively high temperature can cause structural change of the porous layer 101, or diffusion of an impurity from the substrate to the epitaxial layer. Therefore, the temperature and the heating time are selected such that the above disadvantages are not caused. Specifically, the treatment temperature is preferably in the range of from about 600° C. to 1100° C. Some substrates are not capable of enduring heat treatment at a high temperature. For example, a quartz glass as the substrate 110 is required to be treated at a temperature lower than about 200° C. because of the difference of the thermal expansion coefficient of quartz from that of silicon. Above that temperature, the laminated substrates may come to be separated or cracked by stress. The substrates after the heat treatment are required only to be resistant to the stresses in polishing or etching of the bulk silicon 100 in the subsequent step. Therefore, the process can be conducted by optimizing the surface treatment conditions for the activation even at a temperature of 200° C. or lower.

Figure 1E:
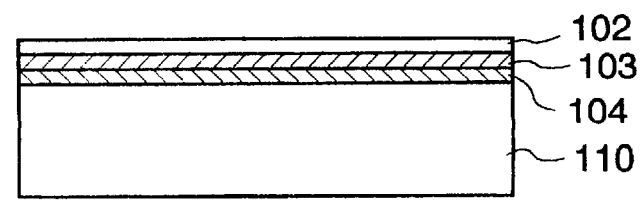

Subsequently, the silicon substrate portion 100 and the porous layer portion 101 are selectively removed with the epitaxial growth layer 102 unremoved (FIG. 1E). First, the silicon substrate portion 100 is removed by polishing or grinding by means of a surface grinder or the like, or by etching with an alkali solution such as potassium hydroxide solution and aqueous ammonia, or an organic alkali solution such as TMAH solution. The etching can effectively be conducted in a warm solution at a temperature of not higher than 100° C. When the supporting substrate is made of a glass plate or a silicon substrate covered with an oxide film, the silicon substrate portion only can be selectively etched by an alkali type solution, since the alkali type solution hardly etches $SiO_2$. It can also be removed by etching with a mixture of hydrofluoric acid, nitric acid, and optionally acetic acid. The hydrofluoric-nitric acid type etchant should not be used for long time for etching since it etches more or less the supporting substrate.

At the time when the silicon substrate portion 100 has been removed by mechanical polishing or chemical etching and the porous portion 101 has come to be bared, the polishing or etching is stopped once. Then the bared porous portion 101 is removed by etching with the aforementioned solution which is capable of etching monocrystalline silicon and $SiO_2$ both at etching rates of not more than 10 Å/min. In the etching, an ultrasonic cleaner is preferably employed for uniformity of the film with care about some rise of etching rate by action of the ultrasonic wave.

In addition to the above-described steps, the steps below may further be conducted.

(1) Oxidation of inner pore walls in porous layer:

In the porous silicon layer, the walls between the adjacent pores are extremely thin in a thickness range of from several nanometers to tens of nanometers. The extremely thin pore walls may coalesce to form thick walls and block the pores in high temperature treatment of the porous layer such as in epitaxial silicon layer formation, and heating after substrate lamination, thus lowering the etching rate. The thickening of the pore walls and coarsening of the pores can be retarded by forming a thin oxide film on the pore walls after the porous layer formation. However, the oxidation should be limited to be at the surface of the inner walls of the pores to keep the monocrystallinity in the interior of the pore walls because the nonporous monocrystalline silicon layer is to be grown epitaxially thereon. The thickness of the formed oxide film ranges preferably from several angstroms to tens of angstroms. Such thickness of the oxide film is formed by heat treatment in an oxygen atmosphere at a temperature ranging preferably from 200° C. to 700° C., more preferably 250° C. to 500° C.

(2) Hydrogen annealing:

It was shown by the inventors of the present invention in EP 553852A2 that fine irregularity of a silicon surface can be removed by heat treatment in a hydrogen atmosphere to give extremely smooth silicon surface. This annealing in a hydrogen atmosphere is applicable in the present invention. For example, the hydrogen annealing can be conducted after porous silicon layer formation and before epitaxial silicon layer formation. Otherwise, the hydrogen annealing may be conducted for SOI substrate obtained by removal of the porous silicon layer by etching. In the hydrogen annealing conducted prior to the epitaxial silicon layer formation, the hydrogen atoms constituting the surface of the porous silicon migrate to block the outermost portion of the pores. With the pores blocked at the outermost portion, the epitaxial silicon layer will be formed with fewer crystal defects. On the other hand, in hydrogen annealing after the etching removal of the porous silicon layer, the epitaxial silicon surface which has been roughened somewhat by etching is smoothed, and boron incorporated unavoidably in the bonding operation from the clean room into the lamination interface is driven off.

Embodiment 2

Embodiment 2 of the present invention is explained by reference to FIGS. 2A–2G. In FIGS. 2A–2G, the same reference numbers are used as in FIGS. 1A–1E for the same members. In Embodiment 1 above, the two substrates are laminated by bonding the $SiO_2$ layer 103 of one substrate with the $SiO_2$ layer 104 of another substrate. However, only at least one of the surfaces to be bonded is required to be constituted of $SiO_2$.

Figure 2A:
FIGS. 2A–2G illustrate schematically another example of the process of the present invention.
Figure 2B:
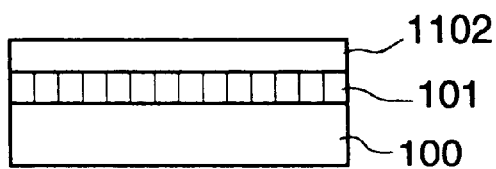
Figure 2E:
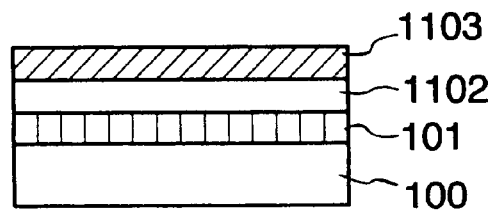
Figure 2C:
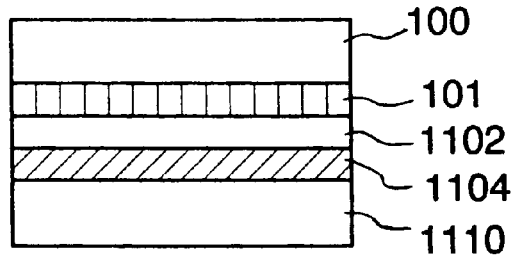

In one example of Embodiment 2, an epitaxial silicon layer 1102 in FIG. 2B formed on a porous silicon layer 101 is bonded with an oxide layer 1104 in FIG. 2C formed on a second substrate 1110.

Figure 2F:
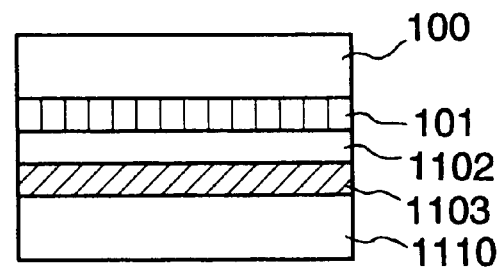
Figure 2D:
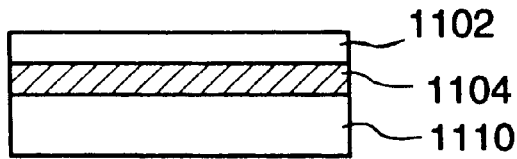
Figure 2G:
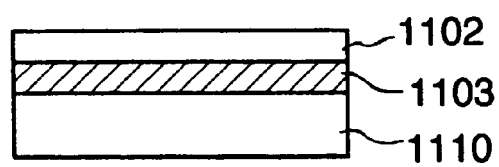

In another example of Embodiment 2, the surface of an epitaxial silicon layer 1102 in FIG. 2E is thermally oxidized, and the resulting oxide film 1103 is bonded with the surface of a non-oxidized silicon substrate 1110 as shown in FIG. 2F.

In this Embodiment, the other steps are conducted in the same manner as in Embodiment 1. Thus, silicon substrate portion 100 and porous layer portion 101 are removed from the FIGS. 2C and 2F structures using previously described methods, to produce the structures shown in FIGS. 2D and 2G.

Embodiment 3

Embodiment 3 of the present invention is explained by reference to FIGS. 3A–3G. In FIGS. 3A–3G, the same reference numbers are used as in FIGS. 1A–1E for the same members. This Embodiment 3 is characterized by a glass material 1210 (FIGS. 3C and 3F) such as quartz glass and blue plate glass employed as the second substrate to be laminated onto the first substrate (FIGS. 3B and 3E) having an epitaxial silicon film formed thereon.

Figure 3A:
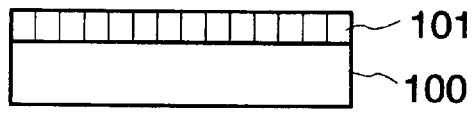
FIGS. 3A–3G illustrate schematically still another example of the process of the present invention.
Figure 3B:
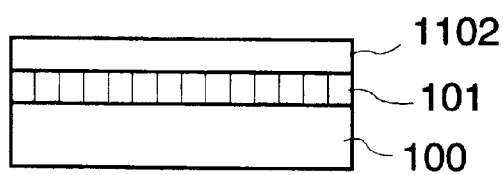
Figure 3E:
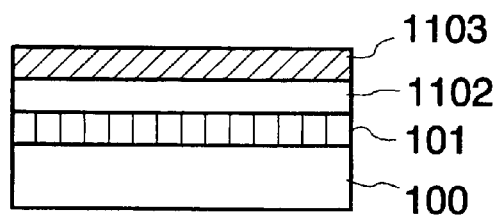
Figure 3C:
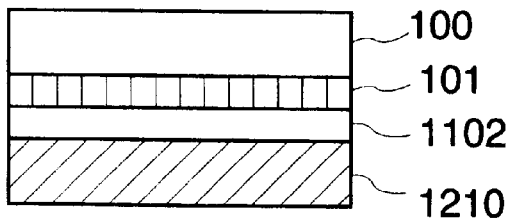

In one example of this Embodiment 3, an epitaxial silicon layer 1102 in FIG. 3B is bonded to a glass substrate 1210 in FIG. 3C.

Figure 3F:
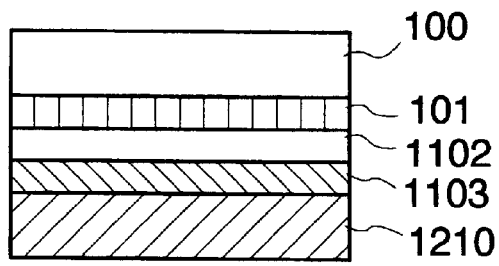
Figure 3D:
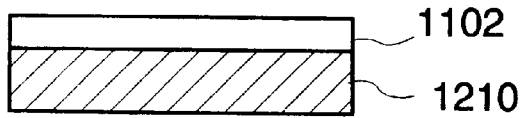
Figure 3G:
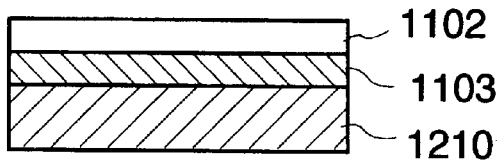

In another example of this Embodiment 3, an oxide film 1103, which has been formed by thermal oxidation of the surface of an epitaxial silicon layer 1102 in FIG. 3C, is bonded to a glass substrate 1210 as shown in FIG. 3F.

In this Embodiment, the other steps are conducted in the same manner as in Embodiment 1.

The present invention is described below more specifically by reference to Examples.

EXAMPLE 1

A P-type (100) monocrystalline silicon substrate was employed which had a thickness of 625 µm, a size of 5 inches, and a resistivity of 0.1–0.2 Ωcm. This silicon substrate was set in an apparatus shown in FIG. 8A, and was anodized. Thereby, a porous silicon layer 101 was formed in a thickness of 20 µm on the surface of the silicon substrate 100 (FIG. 1A). A 49% HF solution was used as the solution 604. The anodization was conducted at a current density of 1 mA/cm$^2$. The porous layer forming rate was about 1 µm/min, and a 20-µm thick porous layer was obtained in about 20 minutes.

On the resulting porous silicon layer 101, a monocrystalline silicon layer 102 was grown epitaxially in a thickness of 0.25 µm (FIG. 1B) by CVD under the deposition conditions below:

Gas employed: $SiH_4/H_2$

Gas flow rate: 0.62/140 (L/min)

Temperature: 850° C.

Pressure: 80 Torr

Growth rate: 0.12 µm/min

The resulting substrate was treated at 900° C. in a water vapor atmosphere to form an oxide film 103 of 0.1 µm thick (FIG. 1C).

The above surface-oxidized substrate and another separately prepared 5-inch substrate 110 having a 0.5-µm oxide film 104 on the surface thereof were cleaned with a cleaning system employing an acid and ammonia, and dried by a spin drier. The treated faces of the substrates were laminated together to form a laminate (FIG. 1D). The laminate was heat-treated at 800° C. for 6 hours.

After the heat treatment, the 610-µm portion of the silicon substrate 100 was polished by a surface polishing machine to bare the porous silicon 101. This substrate was then immersed into a selective etching solution, and the porous portion 101 only was entirely etched off by application of ultrasonic wave (FIG. 1E) under the conditions below:

Selective etching solution:
Aqueous TMAH solution (24 ppm)
Silicon etching rate: 5 Å/min
$SiO_2$ etching rate: 1 Å/min or less The resulting SOI substrate had a silicon oxide film of 0.6 μm thick thereon and a monocrystalline silicon film of about 0.2 μm thick further thereon. The density of the voids in the SOI film was reduced by a factor of about 1/100 in comparison with conventional ones which are prepared by etching the porous layer with an etching solution of high $SiO_2$-etching rate.

EXAMPLE 2

Example 2 is explained by reference to FIGS. 4A–4E.

A P-type (100) monocrystalline silicon substrate 200 was employed which had a thickness of 300 μm, a size of 4 inches, and a resistivity of 0.01 Ωcm. The surface layer of the silicon substrate was changed to a porous silicon layer 201 in a thickness of 20 μm (FIG. 4A) in the same manner as in Example 1.

Figure 4A:
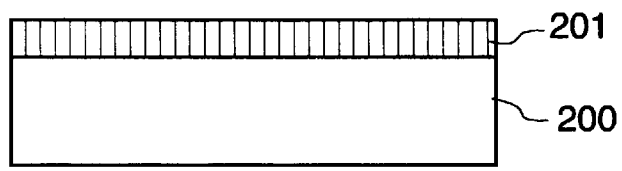
FIGS. 4A–4E illustrate schematically a further example of the process of the present invention.
Figure 4B:
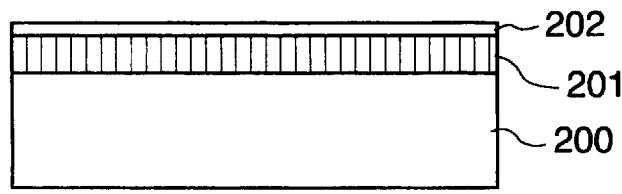

On the resulting porous silicon layer surface, a monocrystalline silicon layer 202 was grown epitaxially in a thickness of 0.15 μm in the same manner as in Example 1 (FIG. 4B).

Figure 4C:
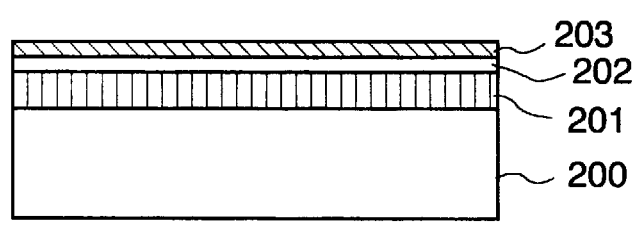

The resulting substrate was treated at 1000° C. in a water vapor atmosphere to form an oxide film 203 of 0.1 μm thick (FIG. 4C).

Figure 4D:
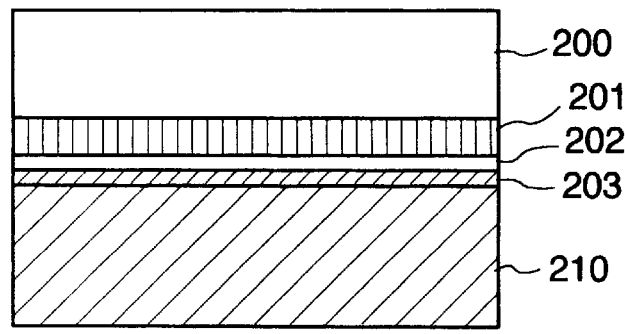
Figure 4E:
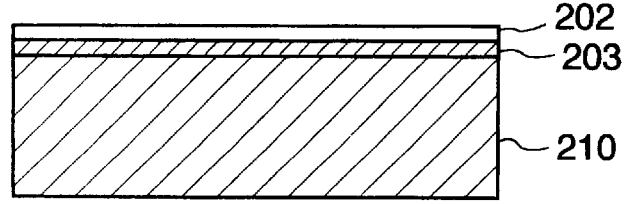

The above surface-oxidized substrate 200 and another separately prepared 4-inch quartz substrate 210 were cleaned, and the mirror faces of the substrates were bonded together to form a laminate (FIG. 4D). The laminate was heat-treated at 180° C. for 24 hours.

After the heat treatment, the 280 nm thick silicon substrate 200 was etched with a mixture of hydrofluoric acid/nitric acid/acetic acid (1:10:10) to bare the porous silicon 201 on the surface.

Then the porous layer 201 was selectively etched with a mixture of hydrofluoric acid/hydrogen peroxide (1:300) (FIG. 4E) at the etching rates below:

Silicon etching rate: 3 Å/min
$SiO_2$ etching rate: 6 Å/min or less

The resulting SOI substrate had a monocrystalline silicon thin film of about 0.1 μm thick thereon. The density of the voids in the SOI was reduced by a factor of about 1/100 in comparison with conventional ones which are prepared by etching the porous layer with an etching solution with a high $SiO_2$-etching rate.

EXAMPLE 3

Example 3 is explained by reference to FIGS. 5A–5H.

A P-type (100) monocrystalline silicon substrate 300 was employed which had a thickness of 400 μm, a size of 5 inches, and a resistivity of 0.01 Ωcm. The surface layer of the silicon substrate was changed to a porous silicon layer 301 in a thickness of 20 μm (FIG. 5A) in the same manner as in Example 1.

Figure 5A:
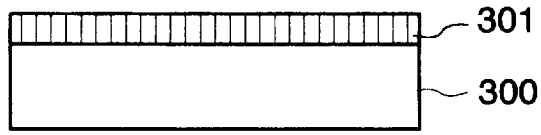
FIGS. 5A–5H illustrate schematically a still further example of the process of the present invention.
Figure 5B:
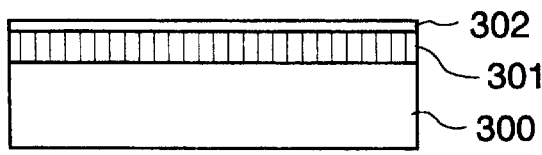
Figure 5C:
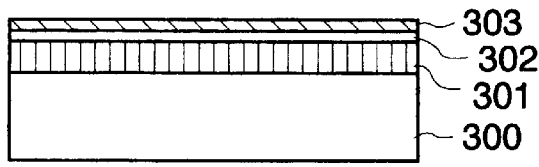
Figure 5D:
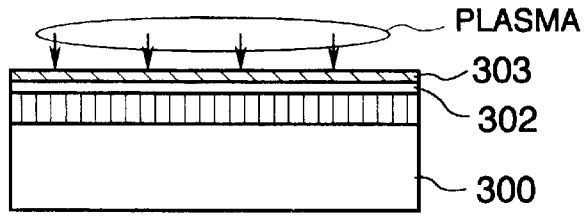
Figure 5E:
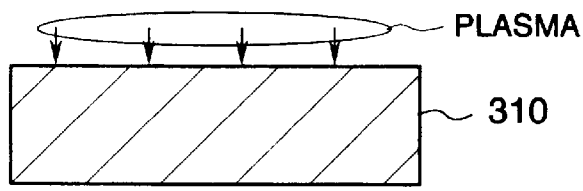
Figure 5F:
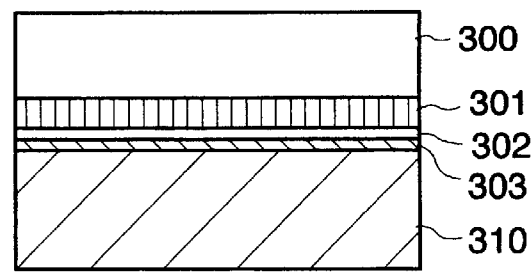

On the resulting porous silicon layer surface, an epitaxial layer 302 was grown in a thickness of 0.5 μm in the same manner as in Example 1 (FIG. 5B).

The surface of the epitaxial layer 302 on the substrate was oxidized at 1000° C. in a water vapor atmosphere to form an $SiO_2$ film 303, 0.2 μm thick (FIG. 5C), leaving a 0.4 μm thick monocrystalline silicon.

The above substrate 300 and another separately prepared synthetic quartz substrate 310 were treated by RF plasma to activate the bonding surface (FIGS. 5D and 5E) under the treatment conditions below:

Gas employed: $CF_4/O_2$
Gas flow rate: 70/6 (sccm)
Pressure: 30 (pa.)
RF output: 350 W
Treatment time: 30 seconds The treated substrates were cleaned with aqueous hydrogen peroxide solution, rinsed further with pure water, and dried. The dried substrates were bonded together (FIG. 5F) to form a laminate. The laminate was pressed at a pressure of 70 tons for 10 minutes.

Without heat treatment, the silicon substrate side of the above substrate laminate was etched by an etching solution. In the etching, the oxide film formed by thermal oxidation covering the silicon substrate was removed by dilute hydrofluoric acid, and then the substrate laminate was immersed into an aqueous 2.4% TMAH solution, and kept therein at 90° C. for 5 hours. Thereby the bulk silicon portion 300 of the silicon substrate side was entirely etched off, baring the porous layer 301.

Figure 5G:
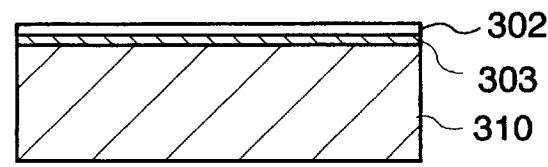

Successively, the porous portion 301 was selectively etched by an aqueous 24-ppm TMAH solution at room temperature (FIG. 5G).

Figure 5H:
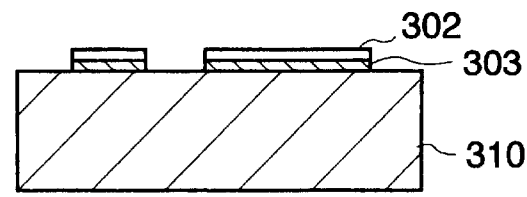

The monocrystalline silicon thin film 302 formed on the quartz substrate 310 prepared through the above steps was subjected to patterning to obtain an island pattern corresponding to the area, shape, and arrangement of an active layer of a designed element (FIG. 5H). After the patterning, as the first step of element formation, the respective island regions were oxidized in an oxygen atmosphere at 1000° C., and simultaneously thermally treated. Thus an SOI substrate was produced which had a monocrystalline silicon thin film of about 0.4 μm thick on a transparent substrate. No void was observed.

EXAMPLE 4

Example 4 is explained by reference to FIGS. 6A–6F.

A P-type (100) silicon substrate 400 was employed which had a thickness of 400 μm, a size of 5 inches, and a resistivity of 0.01 Ωcm. The surface layer of the silicon substrate was changed to a porous silicon layer 401 to a thickness of 20 μm (FIG. 6A) in the same manner as in Example 1.

Figure 6A:
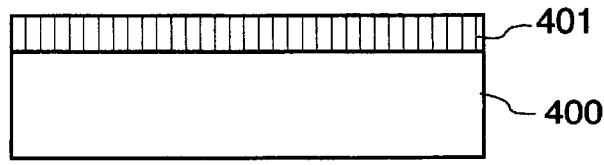
FIGS. 6A–6F illustrate schematically a still further example of the process of the present invention.
Figure 6B:
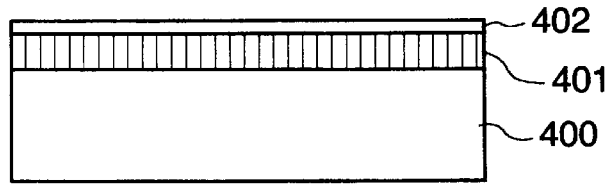

On the resulting porous silicon layer surface, an epitaxial layer 402 was grown to a thickness of 0.5 μm in the same manner as in Example 1 (FIG. 6B).

Figure 6C:
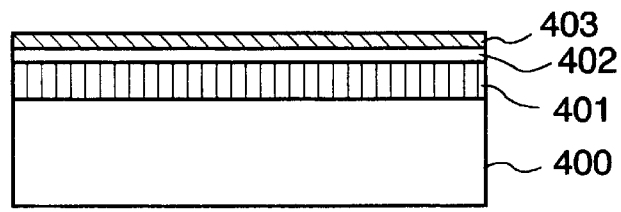

The surface of the epitaxial layer 402 of the substrate was oxidized (thermally oxidized) at 900° C. in a water vapor atmosphere to form an $SiO_2$ film 403 0.05 μm thick (FIG. 6C).

Figure 6D:
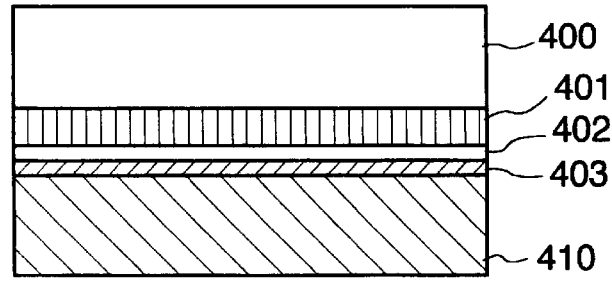

The resulting substrate 400 and another separately prepared 5-inch synthetic quartz substrate 410 were cleaned, and the substrates were bonded together to form a laminate (FIG. 6D). The substrate laminate was heat-treated at 180° C. for 24 hours.

Figure 6E:
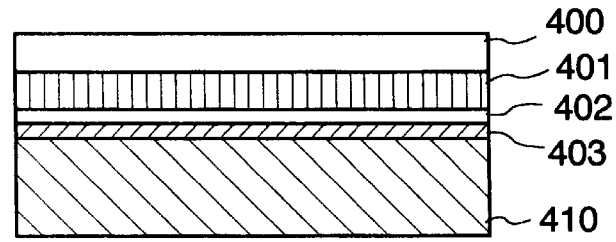
Figure 6F:
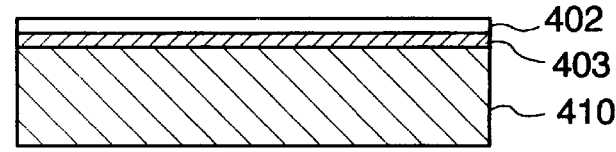

The above substrate laminate was polished from the silicon substrate side by means of a surface polisher to leave 100 μm of the silicon substrate (FIG. 6E). The polished matter was heat-treated at 300° C. for 24 hours.

The remainder of the bulk portion 400 was further polished by the surface polisher to bare the porous silicon portion 401.

Then the porous layer was selectively etched with an aqueous 0.04% ammonia solution (FIG. 6F) at the etching rates below:

Silicon etching rate: 4 Å/min $SiO_2$ etching rate: 1 Å/min or less

The resulting SOI substrate had a thin monocrystalline silicon film 402 of about 0.4 μm thick thereon. The density of the voids in the SOI was reduced by a factor of about 1/100 in comparison with conventional ones which are prepared by etching the porous layer with an etching solution with a high $SiO_2$-etching rate.

EXAMPLE 5

Example 5 is explained by reference to FIGS. 7A–7E.

A P-type (100) silicon substrate 500 was employed which had a thickness of 300 μm, a size of 4 inches, and a resistivity of 0.01 Ωcm. The surface layer of the silicon substrate was changed to a porous silicon layer 501 to a thickness of 20 μm (FIG. 7A) in the same manner as in Example 1.

Figure 7A:
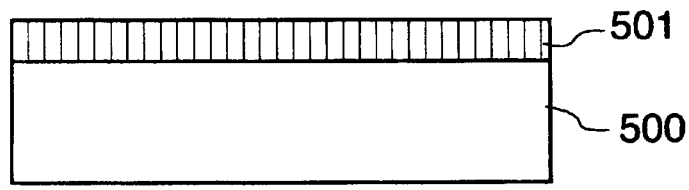
FIGS. 7A–7E illustrate schematically a still further example of the process of the present invention.
Figure 7B:
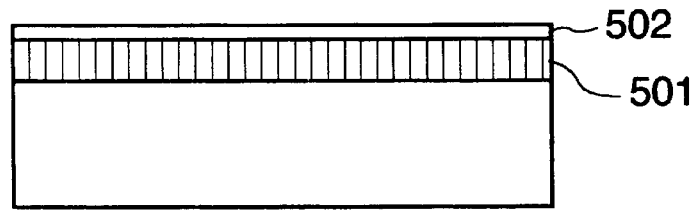

On the resulting porous silicon layer surface, an epitaxial layer 502 was grown to a thickness of 0.15 μm in the same manner as in Example 1 (FIG. 7B).

Figure 7C:
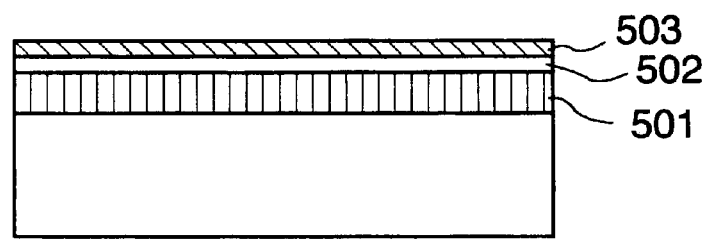

The surface of the epitaxial layer 502 of the substrate was thermally oxidized at 1000° C. in a water vapor atmosphere to form an $SiO_2$ layer 503 to a thickness of 0.1 μm (FIG. 7C). Thereby the oxide film portion had a thickness of 0.1 μm, leaving 0.1 μm of the silicon monocrystalline portion of the epitaxial layer.

Figure 7D:
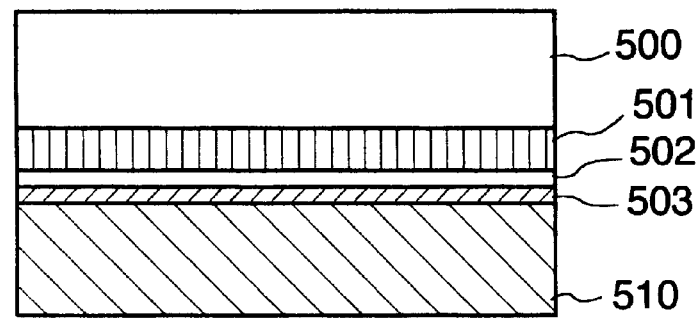
Figure 7E:
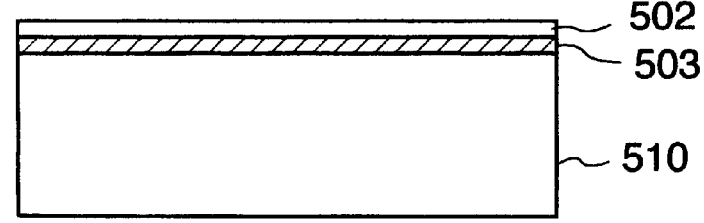

The surface of the epitaxial layer 502 of the above substrate 500 and another separately prepared bare silicon substrate 510 were cleaned with an acid and an alkali, and the substrates were laminated together to form a laminate (FIG. 7D). The substrate laminate was annealed at 1000° C. for 30 minutes.

The above substrate 500 having the epitaxial layer was polished from the side opposite to the epitaxial layer by means of a surface polisher to bare the porous silicon portion 501.

Then the porous layer 501 was selectively etched with a mixture of hydrofluoric acid (49%), nitric acid (70%), acetic acid (100%), and water at a mixing ratio of 1:80:80:340 (FIG. 7E) at the etching rates below:

Silicon etching rate: 4 Å/min $SiO_2$ etching rate: 3 Å/min

The resulting SOI substrate had a silicon oxide film 0.1 μm thick thereon, and a monocrystalline silicon film 0.1 μm thick further thereon. The density of the voids in the SOI was reduced by a factor of about 1/100 in comparison with conventional ones which are prepared by etching the porous layer with an etching solution with a high $SiO_2$-etching rate.

EXAMPLE 6

Example 6 is explained by reference to FIGS. 7A–7E.

A P-type (100) silicon substrate 500 was employed which had a thickness of 300 μm, a size of 4 inches, and a resistivity of 0.01 Ωcm. The surface layer of the silicon substrate was changed to a porous silicon layer 501 with a thickness of 20 μm (FIG. 7A) in the same manner as in Example 1.

The resulting substrate was heat treated at 400° C. in an oxygen atmosphere for one hour to form an extremely thin oxide film on the surface and on the pore walls of the porous silicon layer 501.

Then the surface of the porous layer 501 was immersed into an HF solution to remove the oxide film from the outermost surface of the porous silicon layer 501 with the oxide film on the pore walls left unremoved. Thereby, the porous monocrystalline silicon layer was bared. Subsequently, the substrate was heat treated at 1000° C. in a hydrogen atmosphere for 7 minutes to block the pores at the surface of the porous silicon layer. An epitaxial silicon layer 502 was formed thereon in a thickness of 0.15 μm (FIG. 7B) by introducing dichlorosilane as the starting gas for the epitaxial silicon layer into the film-forming chamber. The surface of the epitaxial silicon layer 502 was thermally oxidized to form an oxide film 503 (FIG. 7C).

The surface of the thermally oxidized film 503 of the above substrate and another non-oxidized silicon substrate 510 were cleaned with an acid and an alkali, and the substrates were bonded together to form a laminate (FIG. 7D). The substrate laminate was annealed at 1000° C. for 30 minutes.

The above substrate 500 having the epitaxial layer was polished from the side opposite to the epitaxial layer by means of a surface polisher to leave a small portion thereof unpolished, and the remaining unpolished portion of the substrate 500 was removed by etching to bare the porous silicon portion 501.

Then the porous layer was selectively etched with a mixture of hydrofluoric acid (49%), nitric acid (70%), acetic acid (100%), and water of a mixing ratio of 1:80:80:340 (FIG. 7E) at the etching rates below:

Silicon etching rate: 4 Å/min $SiO_2$ etching rate: 3 Å/min

The obtained SOI substrate was heat-treated at 1000° C. in a hydrogen atmosphere The resulting SOI substrate had a silicon oxide film 0.1 μm thick thereon, and a monocrystalline silicon film 0.1 μm thick further thereon. The density of the voids in the SOI was reduced by a factor of about 1/200 in comparison with conventional ones which are prepared by etching the porous layer with an etching solution of high $SiO_2$-etching rate.

What is claimed is:

1. A process for producing a semiconductor substrate comprising providing a first substrate made of silicon having a porous silicon layer formed thereon by making the first silicon substrate porous, wherein said porous silicon layer contains pores having inner walls, and a nonporous monocrystalline silicon layer epitaxially grown on the porous silicon layer, laminating the first substrate onto a second substrate in a state that at least one of lamination faces of the first and the second substrates has a silicon oxide layer and the nonporous monocrystalline silicon layer is interposed between the laminated substrates, removing any of said first silicon substrate which remains, and removing the porous silicon layer by etching, wherein the porous silicon layer is removed by etching with an etching solution, wherein the nonporous monocrystalline silicon layer and the silicon oxide layer may be etched at respective etching rates of not more than 10 angstroms per minute by the etching solution.

2. The process for producing a semiconductor substrate according to claim 1, wherein the porous silicon layer is formed by anodization.

3. The process for producing a semiconductor substrate according to claim 1, wherein the silicon oxide layer is formed on the first substrate.

4. The process for producing a semiconductor substrate according to claim 3, wherein the silicon oxide layer is formed by thermal oxidation of the surface of the epitaxially grown nonporous monocrystalline silicon layer.

5. The process for producing a semiconductor substrate according to claim 3 or 4, wherein the second substrate is a monocrystalline silicon substrate.

6. The process for producing a semiconductor substrate according to claim 5, wherein the silicon oxide layer is formed on the lamination face of the second substrate.

7. The process for producing a semiconductor substrate according to claim 5, wherein the lamination face of the second substrate is constituted of monocrystalline silicon.

8. The process for producing a semiconductor substrate according to claim 3 or 4, wherein the second substrate is a glass substrate.

9. The process for producing a semiconductor substrate according to claim 1, wherein the silicon oxide layer is formed on the second substrate.

10. The process for producing a semiconductor substrate according to claim 9, wherein the silicon oxide layer is formed by thermal oxidation of the nonporous monocrystalline silicon layer.

11. The process for producing a semiconductor substrate according to any of claims 9 or 10, wherein the lamination face of the first substrate is the epitaxially grown nonporous monocrystalline silicon layer.

12. The process for producing a semiconductor substrate according to claim 1, wherein the nonporous monocrystalline silicon layer is formed by epitaxial growth after the inner walls of the pores in the porous layer is oxidized.

13. The process for producing a semiconductor substrate according to claim 12, wherein the nonporous monocrystalline silicon layer is formed by epitaxial growth after the porous layer is heat-treated in a hydrogen atmosphere.

14. The process for producing a semiconductor substrate according to claim 1, wherein the etching of the porous silicon layer is conducted with a mixed etching solution composed of hydrofluoric acid and aqueous hydrogen peroxide.

15. The process for producing a semiconductor substrate according to claim 1, wherein the etching of the porous silicon layer is conducted with a mixed etching solution composed of hydrofluoric acid, nitric acid, and optionally acetic acid.

16. The process for producing a semiconductor substrate according to claim 1, wherein the etching of the porous silicon layer is conducted with an alkali or an organic alkali etching solution.

17. The process for producing a semiconductor substrate according to claim 1, wherein the etching of the porous silicon layer is conducted with an aqueous TMAH solution of a concentration of not higher than about 50 ppm.

18. The process for producing a semiconductor substrate according to claim 1, wherein the etching of the porous silicon layer is conducted with a mixed solution of hydrofluoric acid and an aqueous hydrogen peroxide solution at a hydrofluoric acid concentration of not higher than about 0.5% relative to the aqueous hydrogen peroxide solution.

19. The process for producing a semiconductor substrate according to claim 1, wherein heat treatment is conducted in a hydrogen atmosphere after the removal by etching.

20. A process for producing a semiconductor substrate comprising steps of:
providing a first substrate comprised of a porous monocrystalline silicon layer and a nonporous monocrystalline silicon layer;
laminating the first substrate onto a second substrate so as to obtain a multilayered structure wherein a silicon oxide layer lies between lamination faces of the first and second substrates and the nonporous monocrystalline silicon layer is interposed between the laminated substrates; and
removing the porous monocrystalline silicon layer from the multilayered structure by etching with an etching solution, wherein the nonporous monocrystalline silicon layer and the silicon oxide layer may be etched at respective etching rates of not more than 10 angstroms per minute by the etching solution.

21. The process for producing a semiconductor substrate according to claim 20, wherein the laminating step further comprises a heat treatment.

22. The process for producing a semiconductor substrate according to claim 20, wherein the nonporous monocrystalline silicon layer is formed on the porous monocrystalline silicon layer by epitaxial growth.

23. The process for producing a semiconductor substrate according to claim 22, wherein the nonporous monocrystalline silicon layer is formed by a method selected from the group consisting of molecular-beam epitaxy, plasma CVD, reduced pressure CVD, thermal CVD, and sputtering.

24. The process for producing a semiconductor substrate according to claim 22, which process further comprises a step of oxidizing an inner surface of a pore of the porous monocrystalline silicon layer before forming the nonporous monocrystalline silicon layer.

25. The process for producing a semiconductor substrate according to claim 24, wherein the oxidizing step is comprised of a heat treatment of the porous monocrystalline silicon layer at a temperature of 200° through 700° C. in an oxygen atmosphere.

26. The process for producing a semiconductor substrate according to claim 25, wherein the oxidizing step is comprised of a heat treatment of the porous monocrystalline silicon layer at a temperature of 250° through 500° C. in an oxygen atmosphere.

27. The process for producing a semiconductor substrate according to claim 22, which process further comprises a step of annealing the porous monocrystalline silicon layer in a hydrogen atmosphere before forming the nonporous monocrystalline silicon layer.

28. The process for producing a semiconductor substrate according to claim 20, which process further comprises a step of annealing the multilayered structure in a hydrogen atmosphere after removing the porous monocrystalline silicon layer by etching.

29. The process for producing a semiconductor substrate according to claim 20, wherein the porous monocrystalline silicon layer is formed by making at least one portion of a monocrystalline silicon substrate porous by anodization.

30. The process for producing a semiconductor substrate according to claim 20, wherein the second substrate is comprised of a silicon substrate.

31. The process for producing a semiconductor substrate according to claim 20, wherein a set of the second substrate and the silicon oxide layer is formed by oxidizing a surface of a silicon substrate.

32. The process for producing a semiconductor substrate according to claim 20, wherein a set of the first substrate and the silicon oxide layer is formed by oxidizing a surface of the nonporous monocrystalline silicon layer of the substrate comprising the porous monocrystalline silicon layer and the nonporous monocrystalline silicon layer.

33. The process for producing a semiconductor substrate according to claim 20, wherein the silicon oxide layer is comprised of a first silicon oxide layer and a second silicon oxide layer; a set of the first substrate and the first silicon oxide layer is formed by oxidizing a surface of the nonporous monocrystalline silicon layer of the substrate comprising the porous monocrystalline silicon layer and the nonporous monocrystalline silicon layer; and a set of the second substrate and the second silicon oxide layer is formed by oxidizing a surface of a silicon substrate.

34. The process for producing a semiconductor substrate according to claim 20, wherein the first substrate is provided by forming the nonporous monocrystalline silicon layer on the porous monocrystalline silicon layer obtained by making a monocrystalline silicon substrate partially porous, and which process contains a step of removing a region remaining nonporous in the monocrystalline silicon substrate between the laminating step and the step of removing the porous monocrystalline silicon layer by etching.

35. The process for producing a semiconductor substrate according to claim 34, wherein the region remaining nonporous in the monocrystalline silicon substrate is removed by polishing or grinding.

36. The process for producing a semiconductor substrate according to claim 34, wherein the region remaining nonporous in the monocrystalline silicon substrate is removed by etching.

37. A process for producing a semiconductor substrate comprising steps of:
   providing a first substrate comprised of a porous monocrystalline silicon layer and a nonporous monocrystalline silicon layer;
   laminating the first substrate onto a second substrate comprised of a silicon oxide so as to obtain a multilayered structure wherein the nonporous monocrystalline silicon layer is interposed between the laminated substrates; and
   removing the porous monocrystalline silicon layer from the multilayered structure by etching with an etching solution, wherein the nonporous monocrystalline silicon layer and the silicon oxide layer may be etched at respective etching rates of not more than 10 angstroms per minute by the etching solution.

38. The process for producing a semiconductor substrate according to claim 37, wherein the second substrate is comprised of a quartz glass substrate or a crystallized glass substrate.

39. The process for producing a semiconductor substrate according to claim 37, wherein the laminating step further comprises a heat treatment.

40. The process for producing a semiconductor substrate according to claim 37, wherein the nonporous monocrystalline silicon layer is formed on the porous monocrystalline silicon layer by epitaxial growth.

41. The process for producing a semiconductor substrate according to claim 40, wherein the nonporous monocrystalline silicon layer is formed by a method selected from the group consisting of molecular-beam epitaxy, plasma CVD, reduced pressure CVD, thermal CVD, and sputtering.

42. The process for producing a semiconductor substrate according to claim 40, which process further comprises a step of oxidizing an inner surface of a pore of the porous monocrystalline silicon layer before forming the nonporous monocrystalline silicon layer.

43. The process for producing a semiconductor substrate according to claim 42, wherein the oxidizing step is comprised of a heat treatment of the porous monocrystalline silicon layer at a temperature of 200° through 700° C. in an oxygen atmosphere.

44. The process for producing a semiconductor substrate according to claim 43, wherein the oxidizing step is comprised of a heat treatment of the porous monocrystalline silicon layer at a temperature of 250° through 500° C. in an oxygen atmosphere.

45. The process for producing a semiconductor substrate according to claim 40, which process further comprises a step of annealing the porous monocrystalline silicon layer in a hydrogen atmosphere before forming the nonporous monocrystalline silicon layer.

46. The process for producing a semiconductor substrate according to claim 37, which process further comprises a step of annealing the multilayered structure in a hydrogen atmosphere after removing the porous monocrystalline silicon layer by etching.

47. The process for producing a semiconductor substrate according to claim 37, wherein the porous monocrystalline silicon layer is formed by making at least one portion of a monocrystalline silicon substrate porous by anodization.

48. The process for producing a semiconductor substrate according to claim 37, which process further comprises a step of oxidizing a surface of the nonporous monocrystalline silicon layer of the first substrate before the laminating step.

49. The process for producing a semiconductor substrate according to claim 37, wherein the first substrate is provided by forming the nonporous monocrystalline silicon layer on the porous monocrystalline silicon layer obtained by making a monocrystalline silicon substrate partially porous, and which process contains a step of removing a region remaining nonporous in the monocrystalline silicon substrate between the laminating step and the step of removing the porous monocrystalline silicon layer by etching.

50. The process for producing a semiconductor substrate according to claim 49, wherein the region remaining nonporous in the monocrystalline silicon substrate is removed by polishing or grinding.

51. The process for producing a semiconductor substrate according to claim 49, wherein the region remaining nonporous in the monocrystalline silicon substrate is removed by etching.

52. The process for producing a semiconductor substrate according to any of claims 20 through 51, wherein the etchant for etching the porous monocrystalline silicon layer is comprised of a tetramethylammonium hydroxide aqueous solution having a concentration of not more than 50 ppm.

53. The process for producing a semiconductor substrate according to any of claims 21 through 51, wherein the etchant for etching the porous monocrystalline silicon layer is comprised of a mixture of hydrofluoric acid and aqueous hydrogen peroxide solution, wherein the concentration of hydrofluoric acid is not more than 0.5% relative to the aqueous hydrogen peroxide solution.

54. A process for producing a semiconductor member by removing, from a member having a nonporous silicon on a silicon oxide and a porous silicon on said nonporous silicon, said porous silicon, wherein an etching solution having an etching rate not higher than 10 Å/min. in etching both of the silicon oxide and the nonporous silicon is applied to said porous silicon, thereby etching the porous silicon.

* * * * *

UNITED STATES PATENT AND TRADEMARK OFFICE
CERTIFICATE OF CORRECTION

PATENT NO. : 6,103,598
DATED : August 15, 2000
INVENTOR(S) : Kenji Yamagata, et al.

It is certified that error appears in the above-identified patent and that said Letters Patent is hereby corrected as shown below:

ON THE TITLE PAGE AT [56] References Cited

FOREIGN PATENT DOCUMENTS, "5021338" should read --5-021338--; and "6342784" should read --6-342784--.

ON THE TITLE PAGE AT [56] References Cited

OTHER PUBLICATIONS, "Fundamental" should read --Fundamental--;

OTHER PUBLICATIONS, "GaAs," should read --GaAs",--.

COLUMN 1
Line 14, "been" should read --be--.

COLUMN 2
Line 4, "by a factor of several digits" should be deleted;
Line 7, "epitaxially" should read --epitaxially grown--;
Line 46, "substrate" should read --substrate silicon--.

COLUMN 3
Line 58, "portion" should read --portions--.

COLUMN 9
Line 38, "280 nm" should read --280 µm--.

COLUMN 12
Line 33, "atmosphere" should read --atmosphere.--

UNITED STATES PATENT AND TRADEMARK OFFICE
CERTIFICATE OF CORRECTION

PATENT NO.   : 6,103,598
DATED        : August 15, 2000
INVENTOR(S)  : Kenji Yamagata et al.

It is certified that error appears in the above-identified patent and that said Letters Patent is hereby corrected as shown below:

COLUMN 13
Line 26, "is" should read --are--;
Line 51, "hydrof-" should read --hydro---;
Line 52, "luoric" should read --fluoric--;
Line 60, "monoc-" should read --mono---.
Line 61, "rystalline" should read --cyrstalline--.

COLUMN 15
Line 25, "monoc-" should read --mono---;
Line 26, "rystalline" should read --crystalline--.

COLUMN 16
Line 48, "21" should read --20--.

Signed and Sealed this

Twelfth Day of June, 2001

*Attest:*

NICHOLAS P. GODICI
*Attesting Officer*   Acting Director of the United States Patent and Trademark Office